United States Patent [19]
Hohmann et al.

[11] Patent Number: 5,745,988
[45] Date of Patent: May 5, 1998

[54] METHOD FOR PRODUCING DATA CARRIERS

[75] Inventors: Arno Hohmann; Joachim Hoppe; Yahya Haghiri-Tehrani, all of München, Germany

[73] Assignee: Giesecke & Devrient GmbH, Germany

[21] Appl. No.: 492,564

[22] Filed: Jun. 20, 1995

[30] Foreign Application Priority Data

Jun. 21, 1994 [DE] Germany ............ 44 21 607.6

[51] Int. Cl.⁶ ..................................... A05K 3/30
[52] U.S. Cl. ................... 29/841; 235/488; 235/492
[58] Field of Search ...................... 235/488, 492; 29/846, 831, 841

[56] References Cited

U.S. PATENT DOCUMENTS

| | | |
|---|---|---|
| 4,674,175 | 6/1987 | Stampfli ............... 235/488 X |
| 4,829,666 | 5/1989 | Haghiri-Tehrani et al. . |
| 4,835,846 | 6/1989 | Juan et al. ............. 235/492 X |
| 4,863,546 | 9/1989 | Melzer et al. . |
| 4,996,411 | 2/1991 | Rebjock ............... 29/831 X |
| 4,999,742 | 3/1991 | Stampfli . |
| 5,023,751 | 6/1991 | Stampfli ............... 29/846 X |
| 5,322,989 | 6/1994 | Long et al. . |
| 5,371,346 | 12/1994 | Menoud ............... 235/492 X |

FOREIGN PATENT DOCUMENTS 0 418 759   3/1991   European Pat. Off. .

*Primary Examiner*—Carl J. Arbes
*Attorney, Agent, or Firm*—Bacon & Thomas

[57] ABSTRACT

The invention relates to a method for producing data carriers containing a positioned element on at least one of their surfaces from a multiple-copy sheet. As many method steps as possible are performed on the multiple-copy sheet which is subdivided, before the elements are positioned in the data carriers, into smaller units having positioning markings as position references. Using these markings the small units are brought in an exact position relative to various working stations, where several data carriers in the units are provided with a positioned element simultaneously.

6 Claims, 6 Drawing Sheets

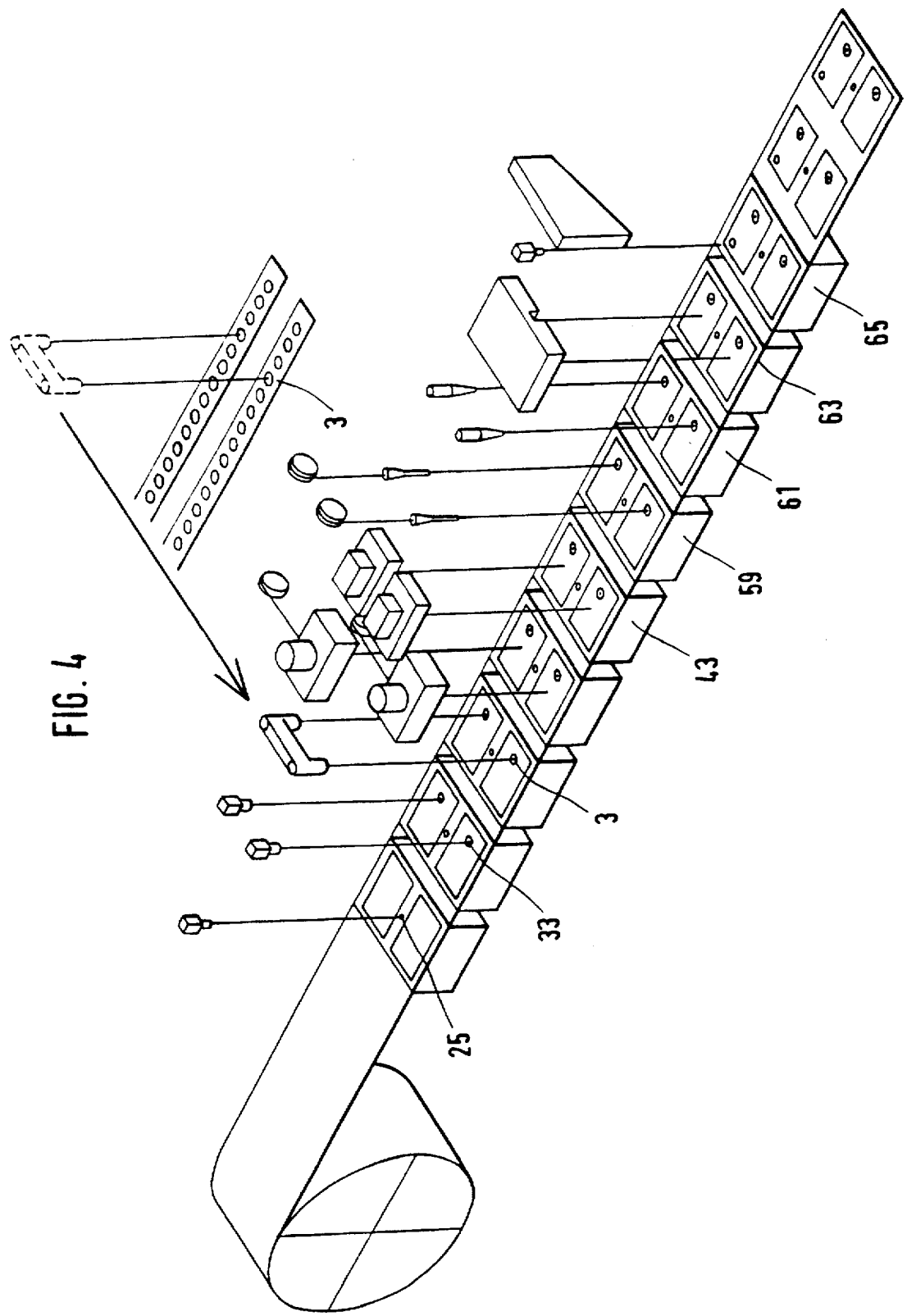

35
37
39

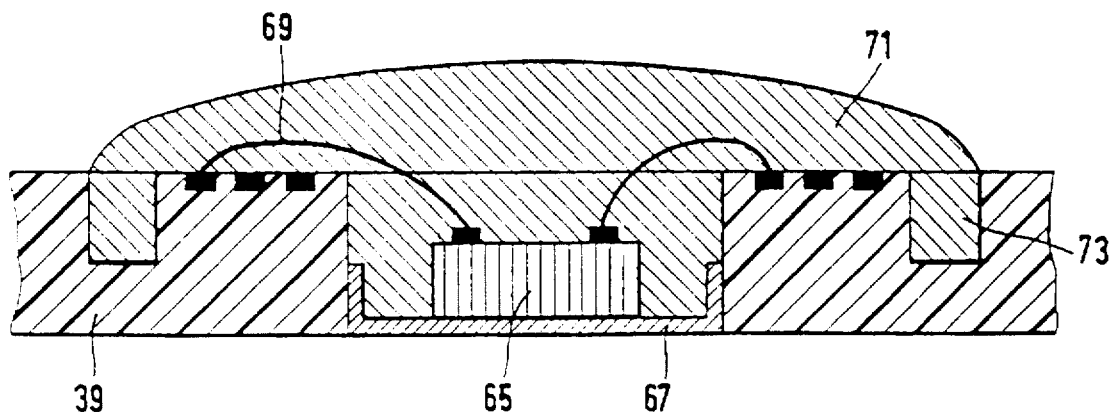
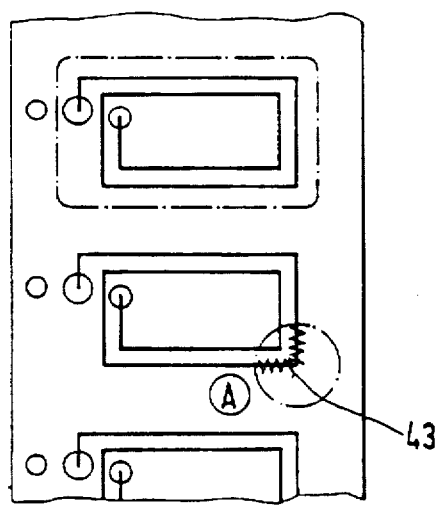
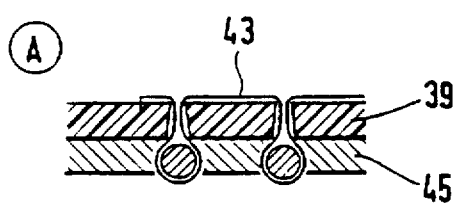

METHOD FOR PRODUCING DATA CARRIERS

FIELD OF THE INVENTION

This invention relates to a method for producing printed identity cards or other data carriers containing at least one element located in a defined position on the surface of the card, for example an electronic module, magnetic stripe, signature stripe, etc., from a multiple-copy sheet or web.

RELATED TECHNOLOGY

In the past various identity cards or other data carriers for various applications have become known, such as bank cards, telephone cards, health insurance cards, employee's ID cards, etc. The cards are provided with different elements in accordance with their purpose. For example, bank cards have a magnetic stripe, a signature stripe and a hologram, whereas telephone cards have an electronic module. Further elements are conceivable on the surface of the card. With all cards, however, the abovementioned elements are placed on, or integrated into, the card body in a defined and sometimes even standardized position.

The abovementioned data carriers can be produced by various methods which can be classed roughly in two groups, namely single card production and multiple-copy production.

In single card production the abovementioned elements can be positioned very exactly because each individual card is brought in an exact position relative to the tool used for processing the card body or providing it with additional elements. Single card production is thus preferably used when it is important that the elements be positioned very exactly, e.g. according to a standard. Not only is production of high quality data carriers desirable, however; also desirable is a high number of completed cards per unit of time. In single card production this goal can be reached only by providing more production lines, which requires high expenditures.

It has therefore been proposed that the identity cards be manufactured from a multiple-copy sheet or web. A multiple-copy sheet is first prepared which is then provided with one of the abovementioned elements (e.g. an electronic module) at a certain grid distance in accordance with the size of the cards. Finally the individual cards are punched out of the multiple-copy sheet with a punching tool. The use of multiple-copy sheets thus permits efficient production of cards with positioned elements.

However, optimal throughput can be reached with multiple-copy sheets only if an operation, for example the installation of an electronic module, can be performed with a multiple tool on several cards in the sheet at once. For this purpose it is necessary that these cards simultaneously assume an exactly defined position relative to the tool. Such positioning is not always possible due to tolerances in the multiple-copy sheet. For example, in the production of multiple-copy laminates consisting of several layers distortions can occur in the individual layers during lamination, which means that the printed patterns of the individual cards are not present at a constant grid distance relative to the multiple-copy sheet. Exact simultaneous positioning of several cards of the sheet relative to a tool is then no longer possible.

Further deviations which complicate positioning of the multiple-copy sheet relative to the tool are e.g. disturbances in the flatness of the sheet, and thickness tolerances in the sheet. The latter make it difficult for example to produce a recess with a defined depth for receiving an electronic module in the card body.

The abovementioned positioning difficulties can be solved by performing the necessary working steps on each card individually. In this case the tool can be positioned relative to each card in the sheet. However, this ultimately amounts to the procedure in single card production and is time-consuming, so that although exact positioning of the elements is obtained the throughput cannot be essentially increased over single card production.

It is therefore the object of the invention to provide a method which permits efficient production of identity cards or data carriers with applied elements.

BRIEF SUMMARY OF THE INVENTION

The inventive solution is characterized essentially in that certain method steps, for example printing, are performed on large multiple-copy sheets or webs. These sheets are then subdivided into smaller units which can be positioned more easily and exactly relative to a tool due to lower absolute tolerances, and provided with one of the abovementioned elements. The positioning of the smaller units is done using suitable position markings as position reference points.

The advantages of the invention are in particular that the number of cards manufactured per unit of time can be greatly increased over single card production. Furthermore, more exact positioning of elements relative to single cards is possible compared to previous multiple-copy production, so that the scrap can be clearly reduced over previous multiple-copy production. A further advantage is that the individual components of a multiple tool (e.g. a milling cutter used for milling a recess for receiving an electronic module in several cards at once) do not have to be individually controllable. One can thus dispense with complicated control mechanisms in the tools, which naturally affects the price of the tool.

According to a preferred embodiment of the invention, a multiple-copy sheet is first printed at least on one side in such a way that the sheet has several rows of copies at a certain grid distance. The printing operation and further method steps, for example the laminating of several sheets into a multilayer structure, can be done especially efficiently on large sheets or webs, since the corresponding tools are adapted to processing large sheets. For application of single elements to single copies, the sheet is cut into smaller units with two rows of copies for example. A suitable marking, for example a perforation, is associated with four adjoining copies in each case to permit exact positioning of the smaller sheet units in the tool used for applying the elements.

BRIEF DESCRIPTION OF THE DRAWINGS

Embodiment examples and further advantages of the invention will be explained more closely in connection with the following figures, in which:

FIG. 4 shows a production line for semi-finished products,

FIGS. 6a and 6b shown a coil on a carrier foil,

FIG. 8 shows a cross section through a completed semi-finished product.

DETAILED DESCRIPTION OF PREFERRED EMBODIMENTS OF THE INVENTION

Figure 1:
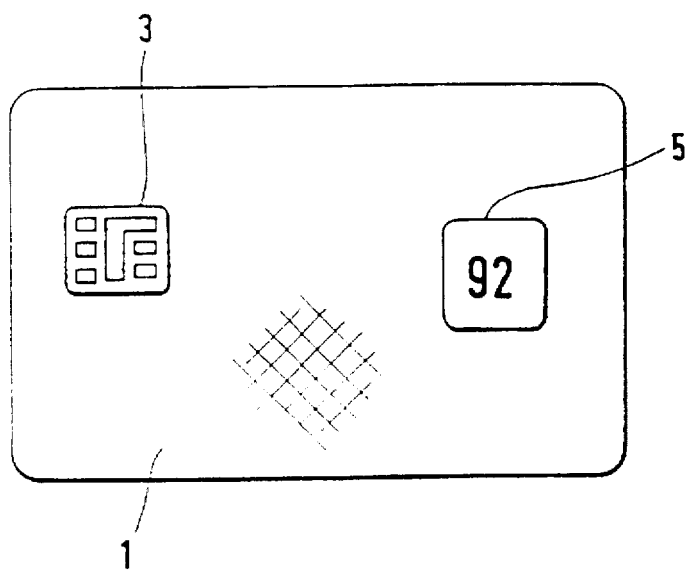
FIG. 1 shows a typical or examplary data carrier in plan view.

FIG. 1 shows data carrier 1 in plan view. Such data carriers can bear a great variety of elements depending on their application. FIG. 1 shows by way of example electronic module element 3 and hologram element 5. The position of electronic module 3 in the card body is fixed by an ISO standard. The hologram is also located at a defined position in the card body. Further elements that may be positioned in the surfaces of data carriers are magnetic stripes, signature stripes, photos, etc. When producing the data carriers one must make sure the elements are incorporated in the card body in the right position. For installing an electronic module in the card body, for example, this means that the recess receiving the electronic module must be produced at the right place with the right depth and that the electronic module must be bonded in the recess in the proper position.

Figure 2:
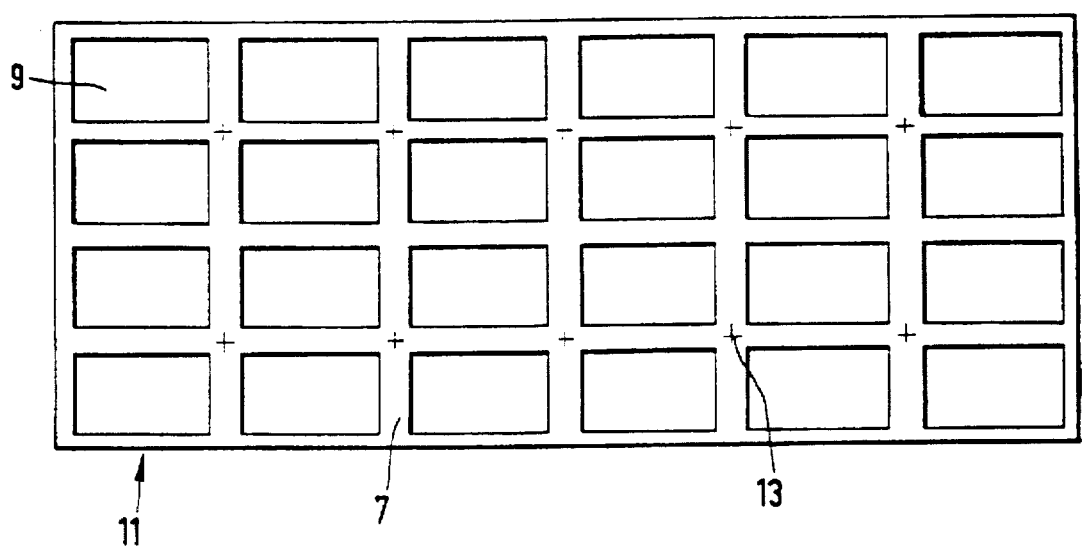
FIG. 2 shows a multiple-copy sheet in plan view.

FIG. 2 shows multiple-copy sheet 7 in plan view, which is provided at least on one side with printed patterns 9 of the data carriers is spaced apart at a certain grid distance (distance between individual printed patterns). Such multiple-copy sheets or webs cannot be manufactured without tolerances. For example, in the production of multiple-copy laminates consisting of several layers, distortions can occur in the individual layers during lamination, which means that printed patterns 9 of the individual cards are not located at a constant grid distance relative to multiple-copy sheet 7. Therefore it is not possible to place several cards of sheet 7, e.g. the cards of row 11, exactly and simultaneously relative to a tool since sheet 7 has no reference edge at a defined distance from all cards.

The abovementioned problems could be avoided by dispensing completely with large multiple-copy sheets or making tools for simultaneously processing several cards in a multiple-copy sheet individually positionable and controllable. In the first case, however, one must completely abandon the advantage of efficient production of multiple-copy sheets, while in the second case the tools must have complicated, expensive control mechanisms.

The invention therefore proposes performing as many method steps as possible which require no exact positioning of elements, for example lamination and printing of layers, on multiple-copy sheet 7 and then subdividing sheet 7 into smaller units. These units have positioning markings 13 which have an exactly defined position relative to several cards. Using these positioning markings one can simultaneously bring several cards in an exact position relative to a multiple tool and simultaneously provide them with different elements. For this purpose the multiple tool is designed so that all positioned cards can be processed simultaneously.

The positioning markings 13 are preferably located at the center of four printed patterns of the cards in each case, and can already be contained in the total printed pattern of the multiple-copy sheet as printed markings 13 (see FIG. 2). The expert will appreciate, however, that position markings can also be provided at other places, e.g. at the edges of the smaller units, as on a film.

FIGS. 3(a)–3(d) shows schematically the inventive method for producing data carriers with positioned elements, here with an electronic module. Multiple-copy sheet 7 according to FIG. 2, or a multiple-copy web, is subdivided into smaller units 29 and 31 with preferably two rows of cards and provided with position holes 25 at the center of four cards in each case. Position holes 25 are produced with a punch which is positioned e.g. with the help of an optical detection system detecting the center of the surrounding cards with reference to the printed markings or other reference marks (e.g. the corners of the printed patterns of the surrounding cards).

Further processing is done on the smaller units which are transported to further processing stations in clocked or indexed fashion by means of position holes 25. The printed data carriers of the small units are positioned relative to a processing station with reference to a basically freely selectable reference edge present in the small unit. The reference edge used, however, is preferably the connecting line of two successive position holes 25, since the printed data carriers surrounding these holes automatically assume an exact position relative to this reference edge. In this case a transport pin engages in each position hole, so that the connecting line of the position holes matches the connecting line of the transport pins and the data carriers thus have a defined position relative to the transport path. The data carriers can thus be guided on the transport path in clocked fashion and exactly positioned relative to the processing stations in seral fashion. In the processing stations several or all exactly positioned cards can be processed simultaneously with a multiple tool of suitable design. In the first processing station the four cards shown may be provided with recesses 33 (FIG. 3(b)) simultaneously by a fourfold milling tool. The milling heads do not need to be individually controlled since the entire tool is already located in the right position relative to the printed cards. It is obvious to the expert that a recess or window can also be produced in the cards in a different way, e.g. by punching.

Figure 3A:
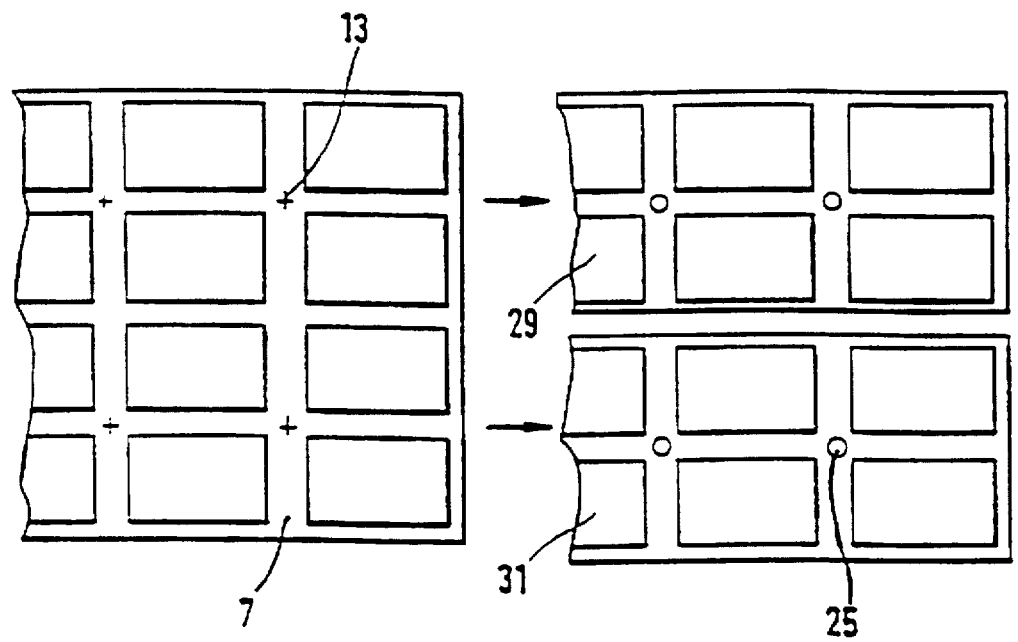
FIGS. 3(a)–(c) show a schematized method sequence for producing data carriers.
Figure 3B:
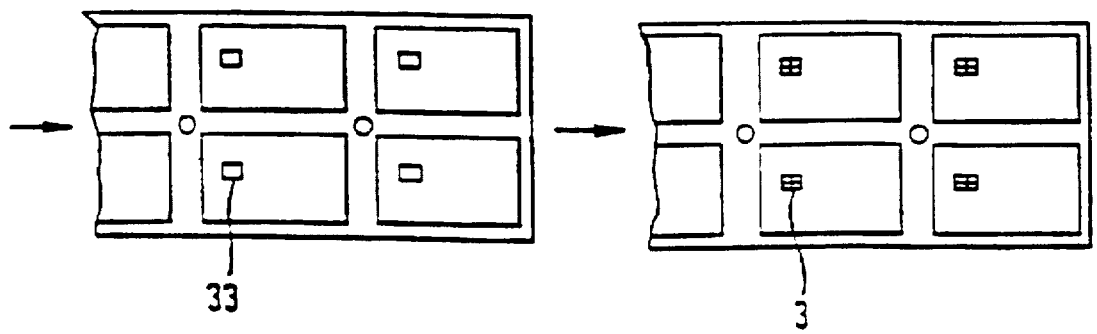
Figure 3C:
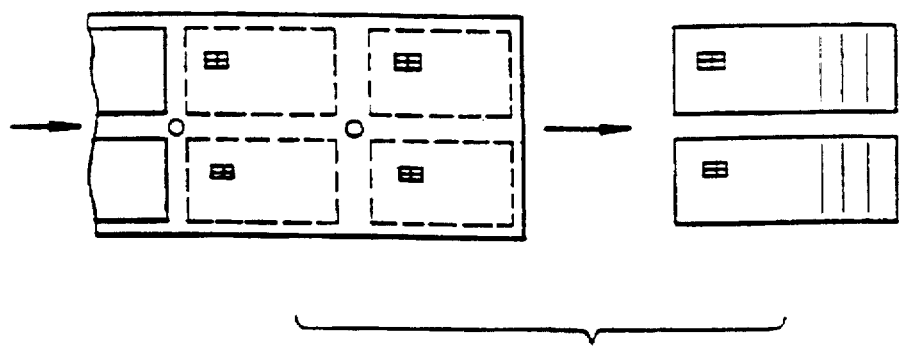

In the following stations, where positioning always takes place by using the same principle, electronic modules 3 may be inserted in the recesses (FIG. 3(b)), the position of the electronic modules checked and cards with deficiently positioned modules marked, the individual cards punched with a fourfold punching tool and finally magazined. The method shown can be used to provide the data carriers with any desired elements.

According to a invention the inventive method can also be used to produce semi-finished products which are integrated into the data carrier later.

FIG. 4 shows by way of example the production of a data carrier layer with an electronic module electrically connected with a coil located on the card layer. This data carrier layer can be installed later in data carriers suitable for noncontacting data exchange. First a foil roll is manufactured which is subdivided into a plurality of foil strips, i.e. smaller units. The foil strips are provided in a first processing station with position holes 25 having a defined position relative to the surrounding card foils. With the help of holes 25 the foil strip is transported to the further processing stations in clocked or indexed fashion, which ensures that the surrounding card foils are located in the right position relative to the tool. In the next station recesses 33 are milled into the foils into which electronic modules 3 are inserted in the subsequent station. In further stations, coils are applied to the individual card foils and fastened there, which can be done in different ways.

For example, a coil can first be produced with the help of a coil winding apparatus wherein the turns of the coil are all in one plane. A corresponding apparatus is shown schematically in FIG. 5a. It comprises conical winding body rotated by a motor and having a holding device (not shown) for the beginning of supplied wire 37. When the beginning of the wire has been fastened in the apparatus the winding body is rotated n times in the direction of the arrow shown and lowered in linear coupling with the rotation so that n wire turns are wound on the winding body according to FIG. 5b. After that the end of the wound wire is clamped in a holding device (likewise not shown), and the remaining wire between the wire supply means and the wire holding device is severed. Finally the wound body is lowered onto foil 39, stripped off the winding body by stripping elements 41 and pressed onto foil 39. The three-dimensional coil shown in FIG. 5b thus results in a coil on foil 39 as shown in FIG. 5c. The coils applied to the foils in this way can be connected with the foil in station 43 (FIG. 4), for example by a heated punch which heats the foil and presses the coils into the foils.

Figure 5A:
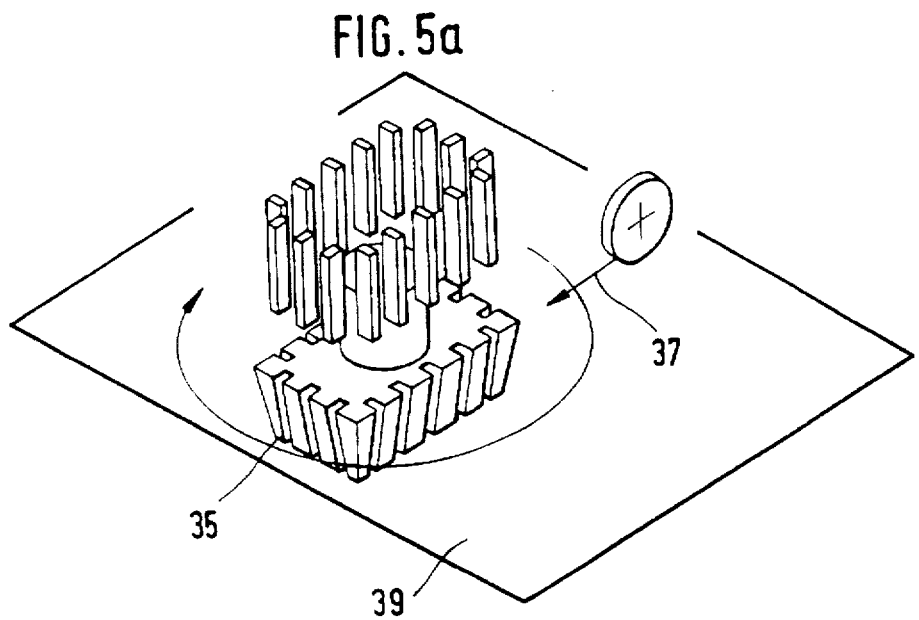
FIG. 5 shows a coil winding apparatus.
Figure 5B:
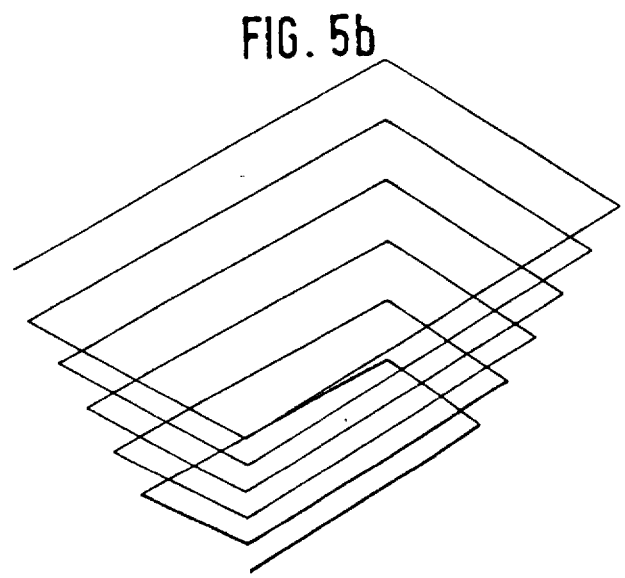
Figure 5C:
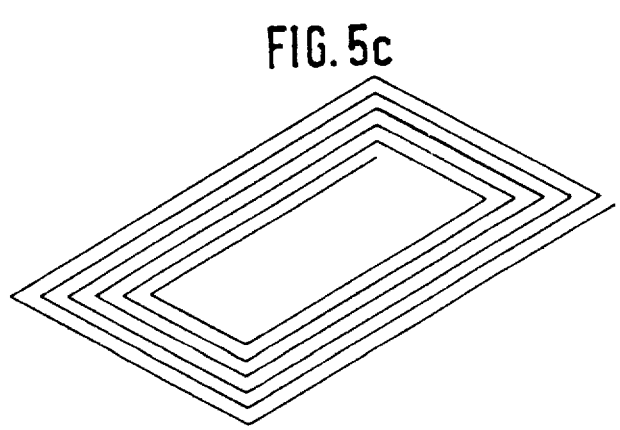

By using the coil winding apparatus shown in FIG. 5a one can produce flat coils whose turns do not touch, as is shown in FIG. 5c. For this reason one can use wires for the coil which have no insulating layer. This is especially advantageous if the ends of the coil are to be connected directly with an integrated circuit, e.g. by bonding, since it is unnecessary to remove an insulating layer at the coil ends. However, the coil winding apparatus can obviously also be used to process wires having an insulating layer. In this case one need not space the turns of the coil apart in flat formation.

Alternatively, it is also possible to fix the coil on the foil with fixing thread 43, which is preferably made of plastic, as shown schematically in FIGS. 6a and 6b. Fixing thread 43 runs around the coil wire exactly like the upper thread runs around the under-thread on the conventional sewing principle, so that the coil is quasi-sewn onto the foil, as indicated schematically in FIG. 6b. With this type of coil fastening it is especially advantageous if a coil carrier made of bonded fabric is used instead of a plastic foil, since one can then embed the coil in the coil carrier when sewing on the coil with the fixing thread, thereby obtaining a plan coil carrier which can be installed in a data carrier later and leaves no deformation there. Alternatively one can use thickness compensation foil 45 in which the coil thread is embedded.

Figure 7A:
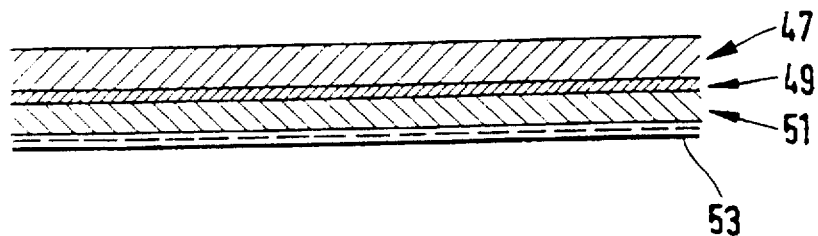
FIGS. 7a–d show a method for applying a coil to a carrier foil.
Figure 7B:
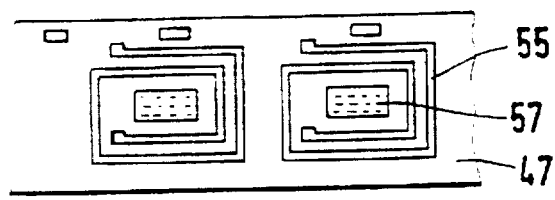

A further possibility for equipping the individual card foils of the multiple-copy sheet or web with coils is to apply the coil to the card foil by the hot stamping method. For this purpose a multilayer film is first produced (see FIG. 7a) which comprises carrier film 47, separation layer 49 (e.g. wax), layer 51 containing the individual coils, and layer of heat-seal lacquer 53. FIG. 7b shows a plan view of the multilayer film. Individual coils 55 are etched out of conductive layer 51 or produced otherwise, and then sprayed with the heat-seal lacquer. In addition to the coils, chip bases 57 can be etched out of conductive layer 51, whose function will be explained later.

Figure 7C:
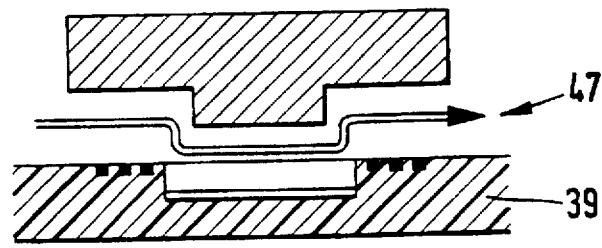
Figure 7D:
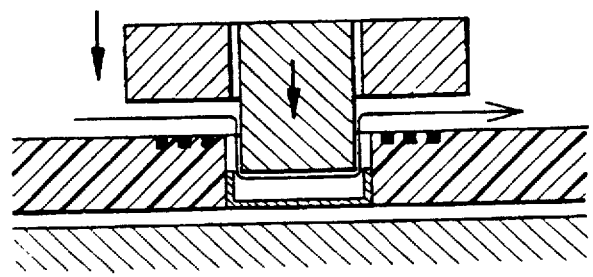

The thus prepared multilayer film is brought in position relative to card foil 39 which already has a recess for receiving the integrated circuit, whereby carrier film 47 is located on the side of the film facing away from the card foil (see FIG. 7c). With a hot-stamping die one softens separation layer 49 and activates layer of heat-seal lacquer 53 so that coil 55 can be transferred to foil 39 and carrier film 47 removed. Additionally the die pressure can be used to press the coil into foil 39. If foil 39 contains a window instead of the recess, as shown in FIG. 7d, coil 55 can first be transferred to foil 39 with the help of a two-part embossing die and the chip base then pressed into the window, resulting in a conductive tub in the window for receiving the integrated circuit.

Finally, one can apply the coil to the card foil by first applying electroconductive particles to the foil which is statically charged locally in the form of the coil to be produced. The particles can be applied all over, whereby the particles located at uncharged places on the foil are subsequently removed, e.g. by an air scream. It is also possible to apply the electroconductive particles locally by guiding a particle stream past the charged foil at a certain distance, the electrostatic attraction between the particles and the charged places on the foil causing particles to be deposited at the charged places. To increase the electrostatic attraction between foil and electroconductive particles one can additionally charge the particles electrostatically conversely to the foil.

In a following processing step the electroconductive particles are fused into conductive paths and firmly connected with the foil. This can be done e.g. in station 43 (FIG. 4) with the help of the heated punches.

After a coil has been mounted on the card foils an integrated circuit is inserted in the recess or chip tub, as indicated in FIG. 5 in station 59, and connected with the coil ends via conductive wires, so-called bonding wires.

In following stations 61 and 63 the integrated circuits are cast with a casting compound to protect them from mechanical loads, and checked for operability. After that the coil carriers having a defective integrated circuit or other defect are marked for example by a punched hole in station 65. Finally the completed semi-finished products can be punched out of the foil strip.

FIG. 8 shows a cross section through a completed punched-out semi-finished product in an exemplary embodiment. Integrated circuit 65 is located in chip recess 67 and electrically connected with the coil via bonding wires 69. For protection from mechanical loads, integrated circuit 65 and bonding wires 69 are cast with casting compound 71 which is formed in a drop shape on foil 39. As a flow stop for the casting compound one can produce groove 73 in foil 39, for example using the abovementioned hot-stamping die.

We claim:

1. A method for producing printed data carriers such as identity cards containing at least one element located in a defined position on a surface of each of said data carriers comprising the steps of:

providing a multiple-copy sheet or web at least on one side with several printed patterns of said data carriers located at a grid distance from each other, subdividing said multiple-copy sheet or web into smaller units each having at least two of said printed patterns of data carriers thereon, providing position markings on said smaller units, positioning said smaller units in at least one processing station using said position markings as position reference points in order to accurately provide said data carriers of said smaller units each with at least said one element in a defined position.

2. The method for producing printed identity cards according to claim 1, wherein providing of said position markings is done by punching position holes having defined positions relative to said printed patterns of said data carriers of said smaller units.

3. The method for producing printed identity cards according to claim 2, wherein said printed patterns contain printed markings for defining the places for punching said position holes.

4. The method for producing identity cards according to claim 2, wherein said smaller units include at least four printed patterns of said data carriers, and wherein each of said defined positions is located at the center of the location of said four data carriers.

5. The method for producing printed identity cards according to claim 1, wherein said printed data carriers are automatically sequentially located in a defined position relative to said respective processing station by using said position markings for indexed transport of said small units sequentially to said processing station and for positioning each of said small units relative to said processing station.

6. The method for producing printed identity cards according to claim 1 wherein subdividing of said multiple-copy sheet or web produces smaller units comprising two rows of printed patterns of said data carriers.

* * * * *